United States Patent
Siniaguine et al.

(10) Patent No.: US 6,398,823 B1
(45) Date of Patent: Jun. 4, 2002

(54) DYNAMIC BREAK FOR NON-CONTACT WAFER HOLDER

(75) Inventors: Oleg Siniaguine, San Jose; Alex Berger, Sunnyvale, both of CA (US)

(73) Assignee: Tru-Si Technologies, Inc., Sunnyvale, CA (US)

( * ) Notice: Subject to any disclaimer, the term of this patent is extended or adjusted under 35 U.S.C. 154(b) by 0 days.

(21) Appl. No.: 09/456,094

(22) Filed: Dec. 7, 1999

(51) Int. Cl.[7] ................................................ H01L 21/00
(52) U.S. Cl. ........................................ 29/25.01; 414/935
(58) Field of Search .......................... 29/25.01; 414/935

(56) References Cited

U.S. PATENT DOCUMENTS

| | | | |
|---|---|---|---|
| 3,594,609 A | 7/1971 | Vas et al. ................... 315/111 |
| 3,639,831 A | 2/1972 | Cushman ..................... 324/33 |
| 3,743,781 A | 7/1973 | Holden ........................ 219/38 |
| 3,798,408 A | 3/1974 | Foex et al. ................. 219/121 |
| 3,818,174 A | 6/1974 | Camacho ................... 219/121 |
| 3,828,162 A | 8/1974 | Holden ....................... 219/383 |
| 3,980,467 A | 9/1976 | Camacho et al. .......... 75/10 R |
| 4,382,099 A | 5/1983 | Legge et al. ................. 427/34 |
| 4,420,346 A | 12/1983 | Belkin et al. ................. 148/4 |
| 4,517,495 A | 5/1985 | Piepmeier .............. 315/111.21 |
| 4,724,325 A | 2/1988 | Armstrong et al. ...... 250/443.1 |
| 5,041,713 A | 8/1991 | Weidman ............... 129/121.51 |
| 5,560,779 A | 10/1996 | Knowles et al. ............ 118/723 |
| 5,562,841 A | 10/1996 | Kulik et al. ........... 219/121.59 |
| 5,609,777 A | 3/1997 | Apunevich et al. .... 219/121.48 |
| 5,719,370 A | 2/1998 | Appunevich et al. .. 219/121.49 |
| 5,782,952 A | 7/1998 | Diaz et al. ................. 75/10.19 |
| 5,895,558 A | 4/1999 | Spence ....................... 204/164 |
| 5,896,877 A | 4/1999 | Pirker ......................... 134/153 |
| 5,954,072 A | 9/1999 | Matusita ..................... 134/149 |

FOREIGN PATENT DOCUMENTS

WO    WO/97 45862    12/1997

*Primary Examiner*—John F. Niebling
*Assistant Examiner*—Stacy A Whitmore
(74) *Attorney, Agent, or Firm*—Skjerven Morrill MacPherson LLP; Michael Shenker

(57) ABSTRACT

The present invention comprises a dynamic brake that applies restraining frictional force to a wafer in a wafer holder while the wafer holder is substantially at rest, but releases the restraining force as the processing carousel containing several wafer holders rotates about a central axis of the carousel. This dynamic brake preferably comprises a boot that passes through an opening in the wafer holder to rest on the surface of the wafer in an exclusion zone near the wafer's edge. The exclusion zone is typically no more than about 3mm in extent. The frictional force between the boot and wafer is sufficient to prevent unwanted motion of the wafer in the holder. As the wafer holder rotates about a central axis of the processing carousel, centrifugal forces applied to the brake arising from such rotation cause the boot to pivot upward, releasing the frictional force on the wafer.

6 Claims, 3 Drawing Sheets

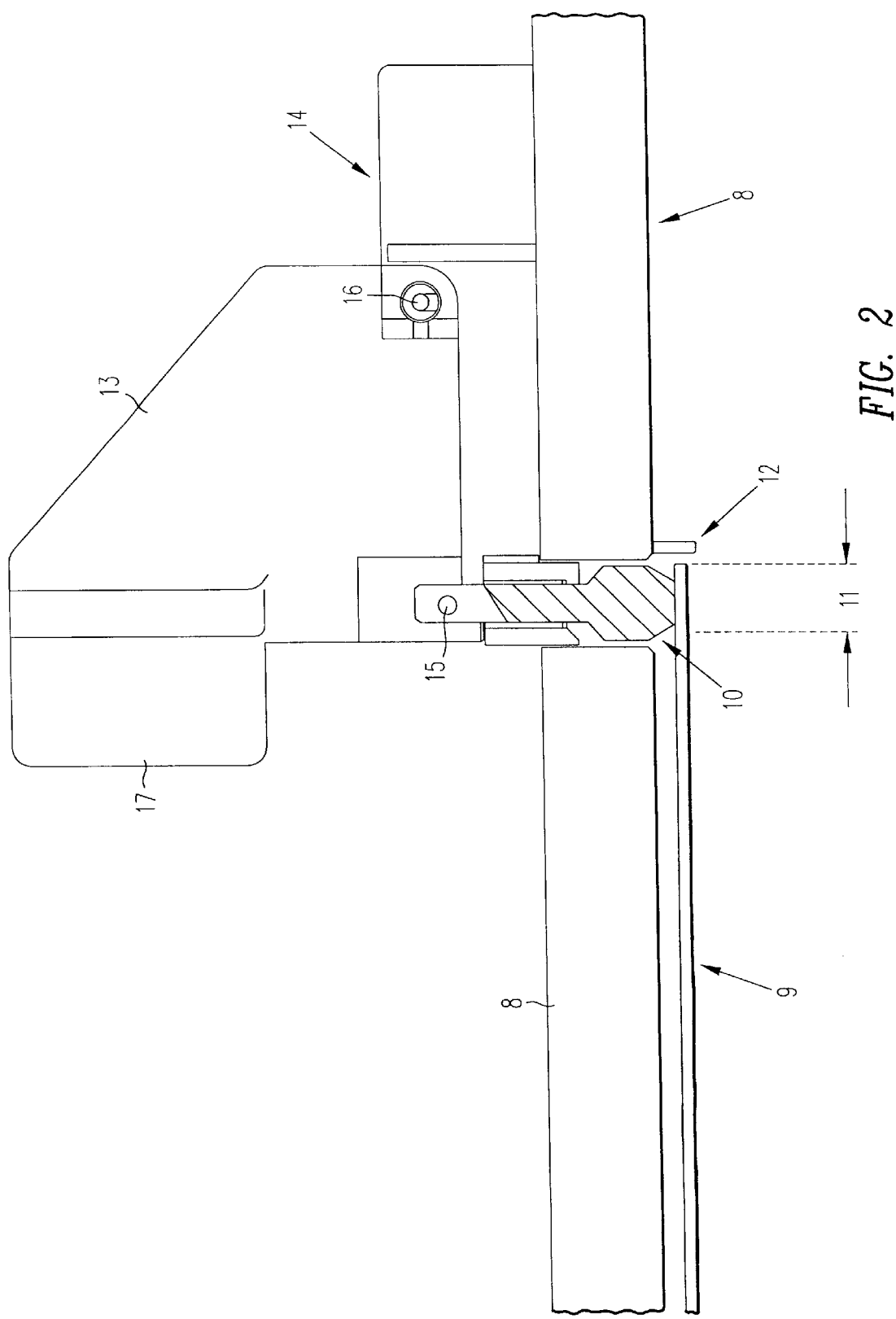

DYNAMIC BREAK FOR NON-CONTACT WAFER HOLDER

BACKGROUND OF THE INVENTION

1. Technical Field

Figure 1A:
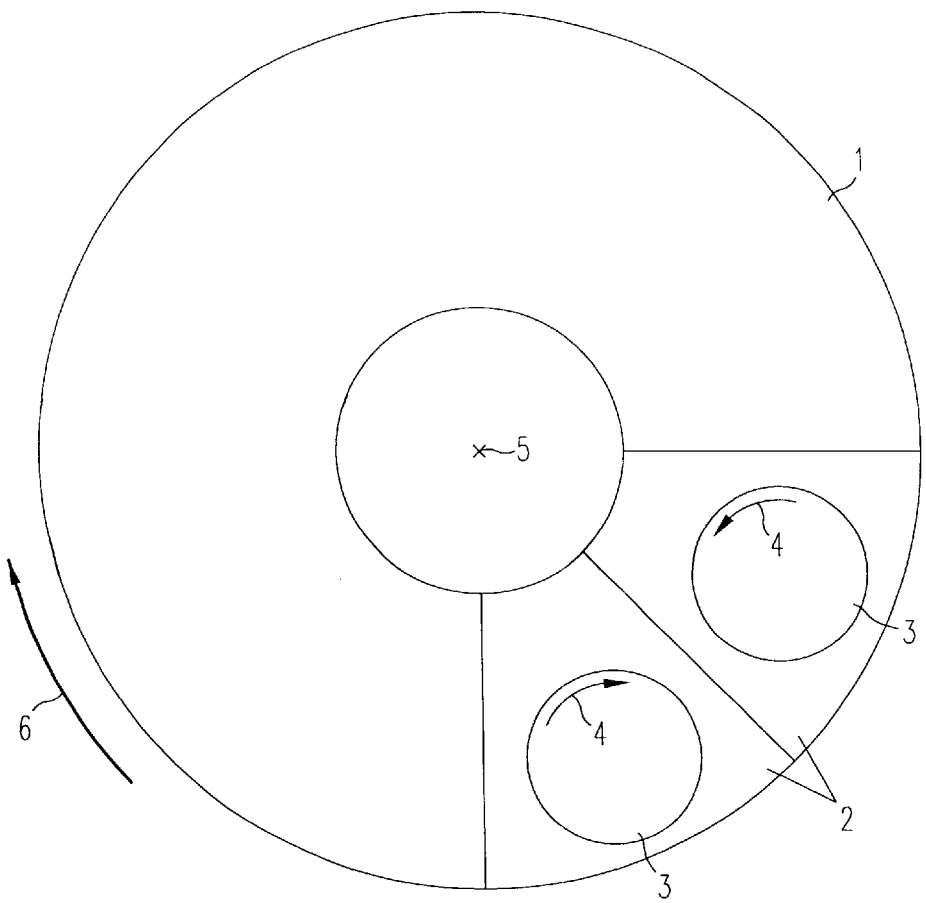

The present invention relates to the processing of flat panels, integrated circuits or other wafer-like objects in a non-contact holder and, more particularly, to apparatus and methods for preventing unwanted motions of the object within the holder.

2. Description of Related Art

Wafer-like objects (hereinafter referred to as "wafers") often require a means to hold the objects in position while performing processing or other operations thereon. Non-contact wafer holders may make use of a cushion of gas (typically air) to maintain a separation between the holder and the object being processed. Therefore, motion of the object in the plane of the holder is virtually frictionless, unless forces in addition to the air cushion are supplied. Holding the object in position in a non-contact holder while avoiding unwanted and possible dangerous motions in the plane of the holder, are among the primary goals of the present invention.

To be definite, we will describe the common instance of the processing of semiconductor wafers as may typically occur in the production of integrated circuits or in wafer post-processing for thinning, etc. However, the processing of any wafer-like object subject to unwanted motion while in a non-contact holder is also a potential area of application for the present invention. Flat panel displays and other rectangular, circular, star-shaped or irregularly shaped planar objects may require mounting in a holder for processing without the risk of damage to the object by contact with the holder. For economy of language we will refer to all such wafer-like objects herein as "wafers" recognizing that such objects may be large (perhaps having a size up to the order of one meter or larger) and need not be rectangular, circular or regular in shape. Since semiconductor wafers are expected to be an important area of application for the present invention, we will describe the primary features of the present invention in terms of semiconductor processing, not intending to limit the invention to this particular choice or particular example. Semiconductor wafers aptly illustrate the features of the present invention and permit obvious modification for use in processing other wafer-like objects.

Integrated circuits are typically fabricated on a wafer of silicon with numerous integrated circuits fabricated on a single wafer. This process requires the wafer to be held in position for the multiple processing steps required to complete circuit fabrication and for processing steps following fabrication of the integrated circuits. However, intimate mechanical contact between the wafer and its holder incurs the risk of damage to the wafer or the devices fabricated on the wafer's surface. This risk of damage increases as wafers become thinner and easily distorted during processing. Thus, wafer holders that do not require mechanical contact between wafer and holder have been developed.

The floating of a wafer above a layer of compressed gas is described in the work of Pirker (U.S. Pat. No. 5,896,877). The wafer is held in position by gravity while the air cushion prevents contact with the wafer holder. Work of Siniaguine and Steinberg (PCT International Publication No. WO 97/45862) describes a non-contact holder for wafer-like objects in which a vortex of rotating air provides both the vacuum support for the wafer and the air cushion.

When the wafer holder is at rest during loading or unloading, the wafer is not stable in the holder. Non-contact wafer holders necessarily provide forces positioning the wafer in a direction perpendicular to the holder. Gravity is used in the work of Pirker while a vortex-created vacuum is used by Siniaguine et. al. However, both approaches to non-contact wafer positioning provide minimal hindrance to the wafer's motion parallel to the surface of the holder. Random forces deriving from the use of an air cushion, or from small rotations of the holder during start-up and shut-down, may result in torques being applied to the wafer. Such torques may lead to undesirable motion of the wafer in its holder and the possibility of wafer damage.

Integrated circuits are typically fabricated in a multi-wafer holder or "carousel," rotating through a plasma for thinning. When the carousel containing many wafers begins to rotate, centrifugal forces press each wafer against limiting pins. A moving wafer contacting limiting pins may chip or perhaps fracture. Damage is more likely if the wafer is thin, typically about 50 microns. Procedures and devices for preventing such unwanted wafer motions during loading and unloading of the carousel are an example of the applicability of the present invention.

BRIEF SUMMARY OF THE INVENTION

Non-contact wafer holders may use vacuum or gravity to keep the wafer in close proximity to the wafer holder while maintaining a separation by means of a gas or air cushion. However, undesired motion of the wafer in the plane of the wafer holder may build up to dangerous rates if not prevented. As wafer holders in a processing carousel rotate about a central axis of the carousel, centrifugal forces are commonly used to hold the wafer firmly against a limiting device, preventing unwanted separate motion of the wafer in its holder. However, after loading of the wafer into the holder but before centrifugal forces arise due to carousel rotation, the wafer may still build up dangerous levels of in-holder motion. Similar risks are encountered during wafer unloading. The present invention comprises a dynamic brake that applies restraining frictional force to a wafer in a wafer holder while the wafer holder is substantially at rest, but releases the restraining force as the processing carousel containing several wafer holders rotates about a central axis of the carousel. This dynamic brake preferably comprises a boot that passes through an opening in the wafer holder to rest on the surface of the wafer in an exclusion zone near the wafer's edge. The exclusion zone is typically no more than about 3mm in extent. The frictional force between the boot and wafer is sufficient to prevent unwanted motions of the wafer in the holder. As the wafer holder rotates about the central axis of the processing carousel, centrifugal forces applied to the brake arising from such rotation cause the boot to pivot upward, releasing the frictional force on the wafer as the same centrifugal forces cause the wafer to press firmly against the limiting pins.

BRIEF DESCRIPTION OF THE SEVERAL VIEWS OF THE INVENTION

The drawings herein are not to scale.

FIG. 1A: A schematic bottom view of a wafer processing carousel.

Figure 1B:
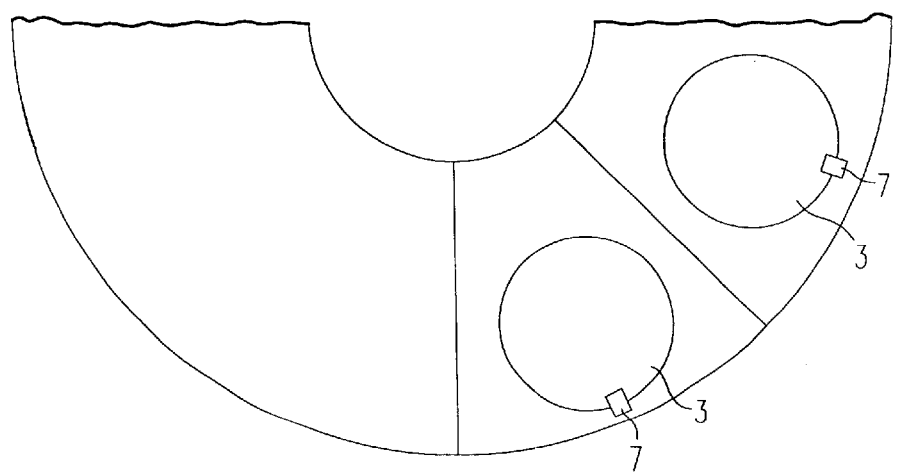

FIG. 1B: A schematic top view of a wafer processing carousel.

FIG. 2: A schematic cross sectional view of the brake of the present invention in its lowered position.

Figure 3:
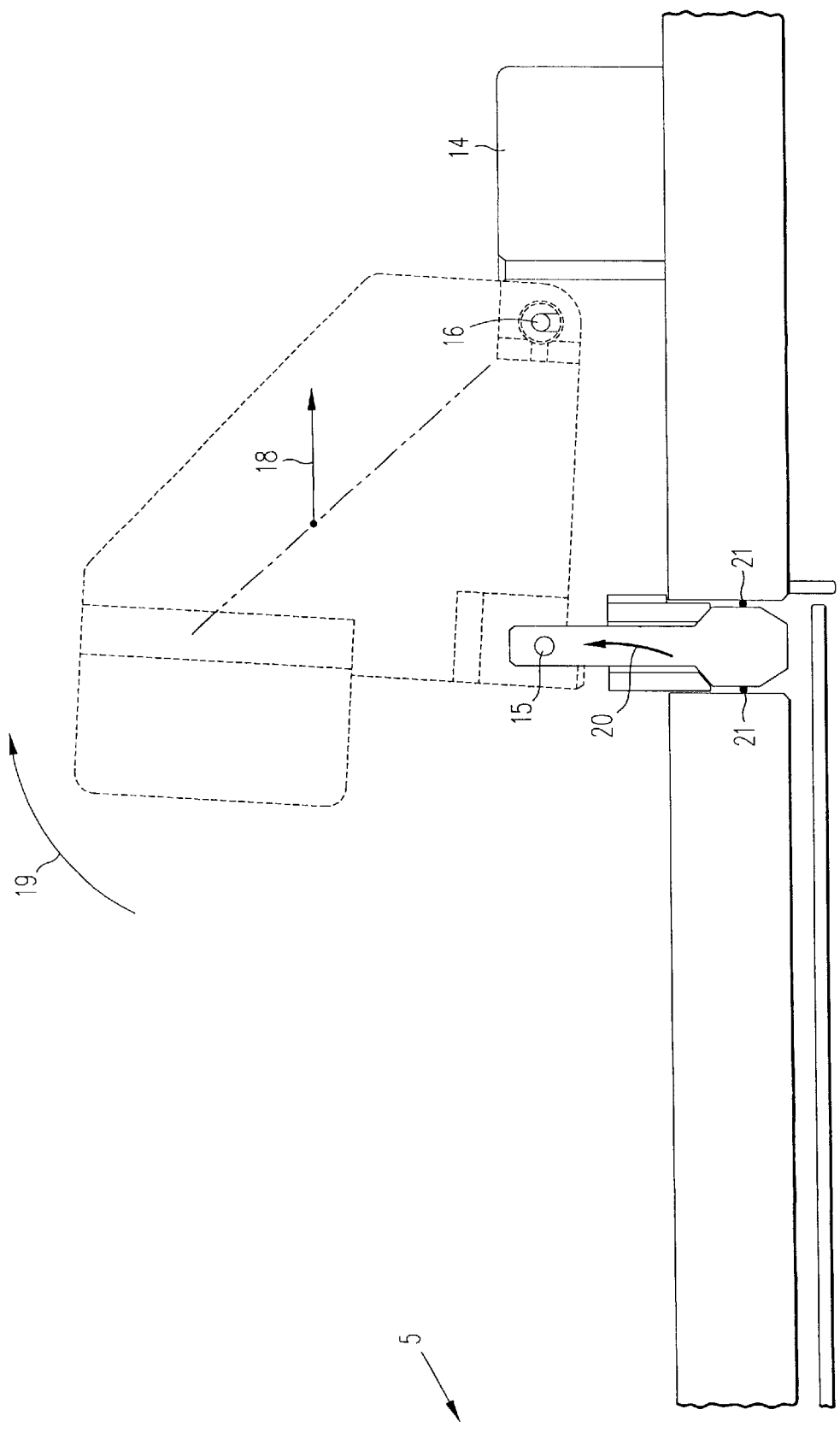

FIG. 3: A schematic cross sectional view of the brake of the present invention in its raised position.

DETAILED DESCRIPTION OF THE INVENTION

In the following description and figures, similar reference numbers are used to identify similar elements.

FIG. 1A depicts a schematic view (not to scale) of a typical wafer processing apparatus commonly referred to as a "processing carousel," 1. The view depicted in FIG. 1A shows the processing carousel, 1, from the side containing the wafers, 3. The vacuum non-contact wafer holder of Siniaguine et. al. typically supports the wafer by means of suction applied from above generated by vortex motion of air or other gas. The holder of Pirker uses weight of the wafer itself to hold the wafer in proximity to the holder. In both cases, a separation between wafer and holder is maintained by means of an air cushion. The present invention is applicable to non-contact wafer holders supporting the wafer from above in the manner of Siniaguine et. al. Thus, we depict in FIG. 1A the view from directly below the wafer holder.

FIG. 1A depicts two segments, 2, of the processing carousel, 1, with wafer holding locations therein, 3. The entire 360° circumference of processing carousel, 1, will typically be divided into segments, 2, and wafer holders, 3. Only two are depicted in FIG. 1A.

Wafers are typically loaded into holders, 3, with processing carousel, 1, being substantially at rest. Non-contact wafer holders interpose an air cushion between the wafer and the holder providing essentially no force to prevent the wafer from moving in a direction parallel to the plane of the holder. Typically, gas will exit from the air cushion more on one side than another inducing a torque in the opposite direction pursuant to Newton's laws of motion. Thus, wafers in the holders may commence rotation, depicted as 4 in FIG. 1A. Furthermore, since the source of torque resulting in rotation is typically unpredictable non-uniformities in air flow, the direction of rotation may be different for different wafers in the processing carousel as denoted by opposite choices for 4 in FIG. 1A. With essentially no frictional force hindering the rotation of the wafer in its holder, the speed of rotation may build to dangerous values. Contact of a rapidly rotating wafer with limiting devices (12 in FIG. 2) may lead to damage of the wafer. Prevention of undesired rotation in non-contact wafer holders is one objective of the present invention.

For economy of language herein we use "wafer rotation" to signify undesired motions of the wafer with respect to its holder and substantially in the plane of the holder, including but not limited to complete rotation of the wafer. It is understood that wafers may undergo various types of rotational and non-rotational motion in the holder, any of which raise the possibility of wafer damage upon contact with the limiting pins or inner surfaces of the holder. The prevention of any such motion is included within the scope of the present invention.

A common mode of semiconductor wafer processing has processing carousel, 1, rotate about its central axis, 5, perhaps through one or more processing zones. Such rotation of the processing carousel, in direction 6 for example, leads to a radially-outward centrifugal force on the wafers. This centrifugal force holds the wafers against suitable limiting pins or similar devices, 12, preventing rotation or other undesired motion of the wafer in its holder. Thus, the present invention relates to a brake preventing rotation of the wafer in its holder when the processing carousel is at rest (or nearly so), but releasing when the processing carousel executes rotational motion.

FIG. 1B views the processing carousel and wafer holders, 3, from the opposite face from the view in FIG. 1A. That is, FIG. 1A views from the side of the processing carousel containing the wafers, FIG. 1B views the processing carousel from the side opposite that containing the wafers. The break of the present invention is positioned on the top (opposite) face of the wafer holder from the wafer, and overlapping the position of the wafer. as depicted schematically by 7 in FIG. 1B.

FIG. 2 depicts in cross sectional view one embodiment of the dynamic brake of the present invention. Wafer, 9, is held in close proximity to holder, 8 by means of an upward-directed vacuum force, with an air cushion maintaining the separation between wafer and holder. An exclusion zone of no more than about 3 mm, 11, on the edge of the wafer, 8, is used in the practice of the present invention, causing the brake to rest in this zone devoid of circuit components. The "exclusion zone" is traditionally reserved for wafer handling purposes. If future generations of integrated circuits decrease the size of the exclusion zone, the dimensions and location of the brake of the present invention will be readily modified to accommodate. A boot, 10, extends through an opening in holder, 8, to make contact with wafer, 9. The contact of boot, 10, and wafer, 9 provides sufficient friction on the wafer to prevent wafer rotation, while making contact with a very limited region of the wafer.

FIG. 3 depicts the cross sectional view of FIG. 2 with processing carousel rotating about its central axis, 5. Rotation of processing carousel, 1, induces a centrifugal force, 18, directed radially outward towards the circumference of the wafer holder. The brake of the present invention, 13, has its center of mass lying above the pivot axis, 16. Therefore, centrifugal force, 18, causes the brake to rotate about pivot axis, 16, in a clockwise direction, 19. Rotation, 19, causes boot, 10, to rise away from the wafer as depicted by 20. A pivot axis for the boot is provided by 15 so boot, 10, may freely rise away from the wafer. While pivot 15 is preferred in the practice of the present invention, it may be omitted in brake designs providing sufficiently smooth extraction of boot 10 away from the wafer and through the wafer holder without such pivot.

When thus raised, boot, 10, is no longer providing frictional stabilization against rotation of the wafer in its holder. However, the same centrifugal force causing brake, 13, to rotate away from the wafer also causes the wafer, 9, to be firmly held against limiting device 12. Thus, the brake of the present invention rotates out of the way as the centrifugal force on the wafer itself prevents wafer rotation by creating contact between the edge of the wafer and a limiting device After having all wafer holders filled with wafers, processing carousel, 1, typically begins to accelerate in angular direction, 6, until the operational angular velocity is reached. Let $R_{min}$ be the minimum rotational (angular) velocity of processing carousel, 1, necessary to hold wafer, 9, snugly against limiting devices, 12. That is centrifugal force on the wafer at $R_{min}$ is sufficient to prevent rotation of the wafer within the wafer holder by means of pressing the wafer against limiting devices, 12. The brake assembly, 13, should be designed with appropriate weight and balance to rotate boot, 10, away from wafer, 9, at a rotational velocity comparable to $R_{min}$. Precision is not necessary in adjusting the rotational velocity at which boot, 10, elevates away from wafer, 9. It is merely necessary that boot, 10, hold wafer, 9, in position for sufficient time. "Sufficient time" as used herein means that the time between release of wafer, 9, from the frictional force of boot, 10, and the stabilization of wafer 9 against limiting devices, 12, is too short for the wafer to build up dangerous angular velocity in the wafer holder. This period of time is determined by the detailed dynamics of the devices wafer, 9. The contact of boot, 10, and wafer, 9 provides sufficient friction on the wafer to prevent wafer rotation, while making contact with a very limited region of the wafer.

FIG. 3 depicts the cross sectional view of FIG. 2 with processing carousel rotating about its central axis, 5. Rotation of processing carousel, 1, induces a centrifugal force, 18, directed radially outward towards the circumference of the wafer holder. The brake of the present invention, 13, has its center of mass lying above the pivot axis, 16. Therefore, centrifugal force, 18, causes the brake to rotate about pivot axis, 16, in a clockwise direction, 19. Rotation, 19, causes boot, 10, to rise away from the wafer as depicted by 20. A pivot axis for the boot is provided by 15 so boot, 10, may freely rise away from the wafer. While pivot 15 is preferred in the practice of the present invention, it may be omitted in brake designs providing sufficiently smooth extraction of boot 10 away from the wafer and through the wafer holder without such pivot.

When thus raised, boot, 10, is no longer providing frictional stabilization against rotation of the wafer in its holder. However, the same centrifugal force causing brake, 13, to rotate away from the wafer also causes the wafer, 9, to be firmly held against limiting device 12. Thus, the brake of the present invention rotates out of the way as the centrifugal force on the wafer itself prevents wafer rotation by creating contact between the edge of the wafer and a limiting device After having all wafer holders filled with wafers, processing carousel, 1, typically begins to accelerate in angular direction, 6, until the operational angular velocity is reached. Let $R_{min}$ be the minimum rotational (angular) velocity of processing carousel, 1, necessary to hold wafer, 9, snugly against limiting devices, 12. That is centrifugal force on the wafer at $R_{min}$ is sufficient to prevent rotation of the wafer within the wafer holder by means of pressing the wafer against limiting devices, 12. The brake assembly, 13, should be designed with appropriate weight and balance to rotate boot, 10, away from wafer, 9, at a rotational velocity comparable to $R_{min}$. Precision is not necessary in adjusting the rotational velocity at which boot, 10, elevates away from wafer, 9. It is merely necessary that boot, 10, hold wafer, 9, in position for sufficient time. "Sufficient time" as used herein means that the time between release of wafer, 9, from the frictional force of boot, 10, and the stabilization of wafer 9 against limiting devices, 12, is too short for the wafer to build up dangerous angular velocity in the wafer holder. This period of time is determined by the detailed dynamics of the devices and can readily be determined by testing. It is often convenient to include as part of brake 13 a balancing weight, 17, to insure that boot, 10, promptly descends and firmly makes contact with wafer, 9, upon deceleration of the processing carousel.

As the carousel slows following wafer processing, the brake descends when the lifting centrifugal force no longer suffices to keep the boot elevated. Thus, the present dynamic brake invention automatically prevents rotation of the wafer in its holder for both loading and unloading.

The present invention is not limited to the processing of semiconductor wafers and, indeed, may process wafer-like objects of relatively large size. There is no inherent mechanical limitation in the present invention for processing flat panel displays or other wafer like objects up to about 1 meter in lateral dimension or larger. There is no restriction in the practice of the present invention that the wafer be circular, rectangular or have any regular shape at all. However, for irregularly shaped objects it is important to position the dynamic brake of the present invention at locations (as depicted in FIG. 1 B) such that boot, 10, always lies upon a wafer. That is, when processing irregular objects, certain orientations of the object may cause boot, 10, to miss the wafer entirely and descend to a position even with or below the wafer, 9. Should this occur, impact of wafer, 9, with such an abnormally descended boot may damage the wafer. The preferred embodiment of the present invention is to locate the dynamic brake at a location 7 such that boot, 10, will contact wafer, 9, no matter how wafer, 9, may be oriented in the holder. Alternatively, guides may be provided such that there is no variation possible in orienting a wafer in the holder, even for irregularly shaped wafers, such that boot, 10, always descends upon a wafer in the same relative location. Yet another possible solution is to provide a "stop" mechanism preventing boot, 10 from descending below the plane of wafer, 9.

It may be useful in the practice of the present invention to limit the gas flow around boot, 10. Therefore, another embodiment of the present invention may include a sealing ring, 21, in the form of an o-ring limiting gas flow around boot, 10, without significantly hindering the motion of boot, 10, in its channel.

The present invention is not limited to rotational motion of a multi-holder carousel. A wafer processing scheme in which each separate wafer undergoes individual rotation may also make use of the present invention. The utility of the present invention lies in that it prevents undesired motion of the wafer when loading or unloading from a substantially stationary wafer holder. But centrifugal forces brought to bear upon rotation of holder, carousel or other structure are felt by the brake of the present invention, leading to its release from the wafer.

Having described the invention in detail, those skilled in the art will appreciate that, given the present disclosure, modifications may be made to the invention without departing from the spirit of the inventive concept described herein. Therefore, it is not intended that the scope of the invention be limited to the specific and preferred embodiments illustrated and described. Rather, it is intended that the scope of the invention be determined by the appended claims.

We claim:

1. A brake for a wafer in a wafer holder comprising:
  a) a boot connected to a first member wherein said boot passes vertically through an opening in said wafer holder and contacts said wafer when said boot is in its lowered position; and,
  b) wherein said first member is pivotally connected to a second member at a second pivot wherein said second member is fixedly attached to the upper surface of said wafer holder; and,
  c) wherein the combined center of mass of said boot and said first member has a position that causes said boot to occupy its lowered position when said wafer holder is at rest and occupy its raised position when said wafer holder rotates.

2. A brake as in claim 1 wherein said boot is pivotally connected to said first member.

3. A brake as in claim 1 wherein said boot contacts said wafer in the exclusion zone of said wafer.

4. A brake as in claim 1 wherein said rotation of said wafer holder results from rotation about an axis of a carousel, said carousel comprising at least one wafer holder.

5. A brake as in claim 4 wherein said second member is fixedly attached to said upper surface of said wafer holder at a location above the periphery of said wafer at maximum distance from said axis of rotation.

6. A brake as in claim 1 further comprising a sealing ring encircling said boot, limiting thereby the flow of gas past said boot.

* * * * *